United States Patent
Kaunisto et al.

(10) Patent No.: US 7,932,792 B2
(45) Date of Patent: Apr. 26, 2011

(54) NANOTUBE DEVICE

(75) Inventors: Risto Kaunisto, Espoo (FI); Jari Kinaret, Mölndal (SE); Eleanor Campbell, Mölndal (SE); Andreas Isacsson, Mölndal (SE); SangWook Lee, Seoul (KR); Anders Eriksson, Göteborg (SE)

(73) Assignee: Nokia Corporation, Espoo (FI)

( * ) Notice: Subject to any disclaimer, the term of this patent is extended or adjusted under 35 U.S.C. 154(b) by 383 days.

(21) Appl. No.: 12/035,866

(22) Filed: Feb. 22, 2008

(65) Prior Publication Data

US 2009/0212884 A1    Aug. 27, 2009

(51) Int. Cl.
*H03H 9/05* (2006.01)
*H03H 9/125* (2006.01)
*H03H 9/24* (2006.01)
*H01L 29/06* (2006.01)
*H01L 29/10* (2006.01)
*H01L 29/12* (2006.01)

(52) U.S. Cl. .......... 333/186; 333/200; 257/25; 977/732; 977/742; 977/932; 977/936

(58) Field of Classification Search .................. 333/186, 333/188, 200; 257/25, 414, 415; 977/742, 977/932, 936, 732, 734, 762
See application file for complete search history.

(56) References Cited

U.S. PATENT DOCUMENTS

| | | | | |
|---|---|---|---|---|
| 6,803,840 B2* | 10/2004 | Hunt et al. | ...................... | 333/186 |
| 7,076,871 B2* | 7/2006 | Horiuchi et al. | ................. | 29/857 |
| 7,253,434 B2* | 8/2007 | Golovchenko et al. | ......... | 257/40 |
| 7,381,625 B2* | 6/2008 | Xi et al. | ......................... | 438/432 |
| 7,618,679 B2* | 11/2009 | Shekhawat et al. | ............ | 427/215 |
| 2006/0139842 A1* | 6/2006 | Shim et al. | ..................... | 361/160 |
| 2006/0197076 A1 | 9/2006 | Adam | | |
| 2006/0223243 A1* | 10/2006 | Radosavljevic et al. | ....... | 438/149 |

FOREIGN PATENT DOCUMENTS

| | | | |
|---|---|---|---|
| JP | 2006-245127 | * | 9/2006 |
| WO | 03/078305 A1 | | 9/2003 |
| WO | 2005112126 A1 | | 11/2005 |
| WO | 2006135336 A1 | | 12/2006 |

OTHER PUBLICATIONS

V. Sazonova et al.; "A Tunable Carbon Nanotube Electromechanical Oscillator"; Letters to Nature, NATURE, vol. 431, pp. 284-287, Sep. 16, 2004.*

S. Li et al.; "Carbon Nanotube GHz Nano-Resonator"; 2004 IEEE MTT-S International Microwave Symposium Digest, vol. 2, pp. 987-990, Jun. 6-11, 2004.*

D.W. Austin et al.; "The Electrodeposition of Metal at Metal/Carbon Nanotube Junctions"; Chemical Physics Letters 361 (2002), pp. 525-529, Aug. 6, 2002.*

L. Dong et al.; "Templated Synthesis and Electron Microscopy Characterization of Pt Nanoparticles via Carbon Nanotube/DNA Molecules" Microsc Microanal 13(Suppl 2), 2007, Microscopy Society of America.*

(Continued)

*Primary Examiner* — Barbara Summons
(74) *Attorney, Agent, or Firm* — Banner & Witcoff, Ltd.

(57) ABSTRACT

A device comprising a nanotube configured as a resonator, a source electrode, a gate electrode, a drain electrode and at least one impeding element, wherein the at least one impeding element is configured to minimize energy loss due to a contact resistance between at least the source electrode and the nanotube.

34 Claims, 10 Drawing Sheets

OTHER PUBLICATIONS

W.-Q. Deng et al.; "Bifunctional Anchors Connecting Carbon Nanotubes to Metal Electrodes for Improved Nanoelectronics", Journal of Amemerian Chemical Society, vol. 129, No. 32, pp. 9834-9835, Jul. 2007 (Web).*

J.-O. Lee et al.; "Formation of Low-Resistance Ohmic Contacts Between Carbon Nanotube aand Metal Electrodes by a Rapid Thermal Annealing Method"; J. Phys. D: Applied Physics 33, pp. 1953-1956, printed in the UK Jun. 2000.*

J. Tersoff; "Contact Resistance of Carbon Nanotubes"; Applied Physics Letters, vol. 74, No. 15, pp. 2122-2124, Apr. 12, 1999.*

International Search Report for PCT/FI2009/050047, dated May 18, 2009, pp. 1-5.

* cited by examiner

NANOTUBE DEVICE

FIELD OF THE INVENTION

The invention relates to a device including a nanotube electrode, and to a method of making such a device.

BACKGROUND TO THE INVENTION

Nanotube devices are known for use in various electrical applications. Since their operation depends on mechanical movement, nanotube devices can be termed NanoElectroMechanical (NEMS) structures.

It is desirable to use carbon nanotubes in tuneable radio frequency (RF) filter technologies, as this could potentially be the main enabler for software-defined and cognitive radio hardware.

WO 03/078305 describes a carbon nanotube device which can be used as a filter.

SUMMARY

A first aspect of the invention provides a device comprising a nanotube configured as a resonator, a source electrode, a gate electrode, a drain electrode and at least one impeding element, wherein the at least one impeding element is configured to minimize energy loss due to a contact resistance between at least the source electrode and the nanotube.

A device thus constructed can result in a reduction in Q-factor degradation.

The impeding element may be a layer of solid insulating material, and a first end portion of the nanotube may be fixed to the source electrode via the layer of solid insulating material, the layer of solid insulating material being interposed between the nanotube and the source electrode.

The nanotube, the source electrode, the gate electrode and the drain electrode may be arranged such that a second end portion of the nanotube extends from the source electrode above the gate electrode and the drain electrode.

The nanotube may be in first capacitive contact with the source electrode, in second capacitive contact with the gate electrode and in third capacitive contact with the drain electrode, wherein the capacitance of the first capacitive contact is greater than the capacitance of the second and third capacitive contacts.

Alternatively, the at least one impeding element may comprise a first layer of solid insulating material and a second layer of solid insulating material, and wherein a first end portion of the nanotube may be fixed to the source electrode via the first layer of solid insulating material, the first layer of insulating material being interposed between the first end portion of the nanotube and the source electrode, and a second end portion of the nanotube may be fixed to the drain electrode via the second layer of solid insulating material, the second layer of insulating material being interposed between the second end portion of the nanotube and the drain electrode.

The nanotube, the source electrode, the gate electrode and the drain electrode may be arranged such that a middle portion of the nanotube, between the first and second end portions, bridges a gap between the source electrode and the drain electrode, the middle portion of the nanotube being positioned generally above the gate electrode.

The nanotube may be in first capacitive contact with the source electrode, in second capacitive contact with the gate electrode and in third capacitive contact with the drain electrode, wherein the capacitances of the first capacitive contact and the third capacitive contact are greater than the capacitance of the second capacitive contact.

Alternatively, the at least one impeding element may comprise an inductive element, the inductive element being connected in series with the source electrode.

The nanotube may be arranged such that a first end portion of the nanotube is in contact with a surface of the source electrode and a second end portion of the nanotube extends from the source electrode generally above the gate electrode and the drain electrode.

Alternatively, the at least one impeding element may comprise a first inductive element and a second inductive element, wherein the first inductive element is connected in series with the source electrode, and the second inductive element is connected in series with the drain electrode.

The nanotube may be arranged such that a first end portion of the nanotube is in contact with a surface of the source electrode and a second end portion of the nanotube is in contact with a surface of the drain electrode, and a middle portion of the nanotube, between the first and second end portions, bridges a gap between the source electrode and drain electrode, the middle portion of the nanotube being positioned generally above the gate electrode.

The source electrode, gate electrode and the drain electrode may be located on a surface of a substrate and the gate electrode may be located generally between the source electrode and the drain electrode.

The device may have a resonant frequency, the resonant frequency being changeable by applying a bias voltage to the gate electrode.

According to a second aspect of the invention, a device is provided, the device comprising a nanotube configured as a resonator, a source electrode, a gate electrode, and a drain electrode, wherein a first end portion of the nanotube is fixed to the source electrode via an interposed layer of solid insulating material.

The nanotube, the source electrode, the gate electrode and the drain electrode may be arranged such that a second end portion of the nanotube extends from the source electrode generally above the gate electrode and the drain electrode.

The nanotube may be in first capacitive contact with the source electrode, in second capacitive contact with the gate electrode and in third capacitive contact with the drain electrode, wherein the capacitance of the first capacitive contact is greater than the capacitance of the second and third capacitive contacts.

Alternatively, the first end portion of the nanotube may be fixed to source electrode via a first layer of solid insulating material and a second end portion of the nanotube may be fixed to the drain electrode via a second layer of interposed solid insulating material.

The nanotube, source electrode, the gate electrode and the drain electrode are arranged such that a middle portion of the nanotube, between the first and second end portions, bridges a gap between the source electrode and the drain electrode, the middle portion of the nanotube being positioned generally above the gate electrode.

The nanotube may be in first capacitive contact with the source electrode, in second capacitive contact with the gate electrode and in third capacitive contact with the drain electrode, wherein the capacitances of the first capacitive contact and the third capacitive contact are greater than the capacitance of the second capacitive contact.

The source electrode, the gate electrode and the drain electrode may be located on a surface of a substrate.

The gate electrode may be located generally between the source electrode and the drain electrode.

The device may have a resonant frequency, the resonant frequency being changeable by applying a bias voltage to the gate electrode.

According to a third aspect of the invention, a device is provided, the device comprising a nanotube configured as a resonator, a source electrode, a gate electrode and a drain electrode wherein the source electrode is in series connection with an inductive element.

A first portion of the nanotube may be in contact with a surface of the source electrode and the source electrode, the gate electrode and the drain electrode are arranged such that a second end portion of the nanotube extends from the source electrode generally above the gate electrode and the drain electrode.

Alternatively, the device may further comprise an inductive element in series connection with the drain electrode.

The nanotube may be arranged such that a first end portion of the nanotube is in contact with a surface of the source electrode and a second end portion of the nanotube is in contact with a surface of the drain electrode, and a middle portion of the nanotube, between the first and second end portions, bridges a gap between the source electrode and drain electrode.

The may further comprise a substrate, wherein the source electrode, the gate electrode and the drain electrode are located on a surface of the substrate.

The gate electrode may be located generally between the source electrode and the drain electrode.

The device may have a resonant frequency, the resonant frequency being changeable by applying a bias voltage to the gate.

Any of the above aspects of the invention may be incorporated into tuneable filtering device, a voltage-controlled oscillator or a mobile terminal.

According to a fourth aspect of the invention a method may be provided, the method, comprising providing a substrate, forming, on the substrate, a source electrode, a gate electrode and a drain electrode forming a layer of solid insulating material in contact with a surface of the source electrode and fixing an end portion of a nanotube to an opposite surface, to that in contact with the source electrode, of the layer of solid insulating material.

Forming the electrodes may comprise forming the gate electrode generally between the source electrode and the drain electrode.

Fixing an end portion of a nanotube, may further comprise fixing a first end portion of the nanotube to the layer of solid insulating material, a second end portion of the nanotube extending generally above the gate electrode and the drain electrode.

Alternatively, the method further comprises forming a second layer of solid insulating material in contact with a surface of the drain electrode, and fixing an opposite end portion of the nanotube to an opposite surface, to that in contact with the drain electrode, of the second layer of solid insulating material.

Fixing the nanotube may comprise growing the nanotube on the layer of insulating solid material from seed.

According to a fifth aspect of the invention, a method is provided, the method comprising providing a substrate, forming, on the substrate, a source electrode, a gate electrode and a drain electrode, connecting an inductive element to the source electrode and fixing an end portion of a nanotube to a surface of the source electrode.

Forming the electrodes may comprise forming the gate electrode generally between the source electrode and the drain electrode.

Fixing an end portion of a nanotube, may further comprise fixing a first end portion of the nanotube to the source electrode, a second end portion of the nanotube extending generally above the gate and drain electrodes.

Alternatively, the method may further comprise connecting a second inductive element to the drain electrode and fixing an opposite end portion of the nanotube to a surface of the drain electrode.

Fixing the nanotube comprises growing the nanotube on the source and drain electrodes from seed.

According to a sixth aspect of the invention, a method of operating a device according to the third aspect is provided, the method comprising applying a reverse voltage pulse to one of the gate and the drain electrode before the expiration of a time period, the time period being a charge relaxation time of the device.

DETAILED DESCRIPTION

Figure 1:
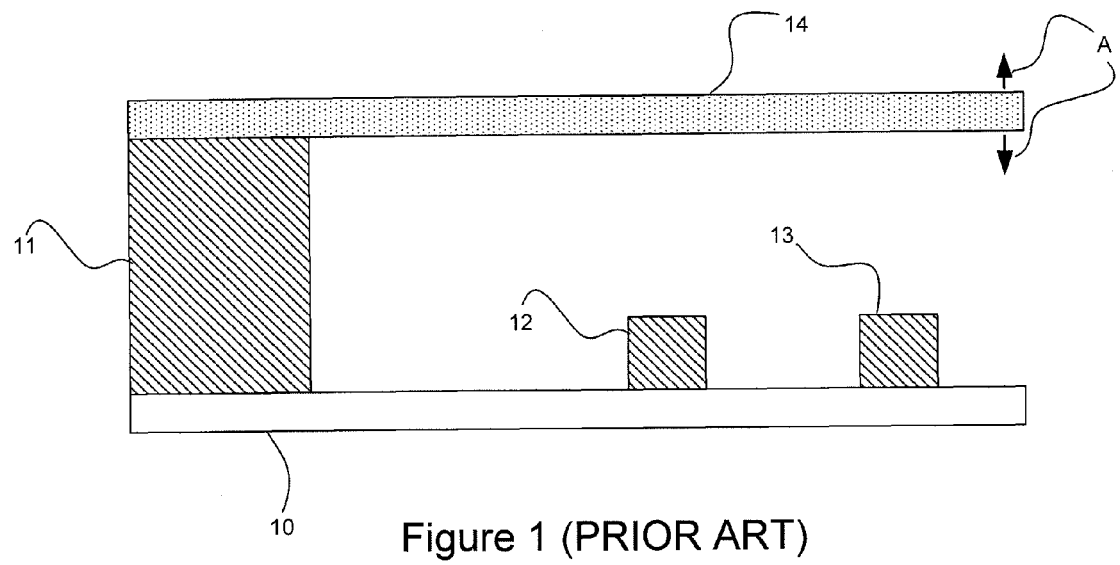
FIG. 1 is a schematic side-view of a singly-clamped nanotube device.

FIG. 1 shows a schematic of a side-view of a singly-clamped nanotube device of the type that may be used in tuneable RF filter technologies. The device comprises a substrate 10, on which are formed a source electrode 11, a gate electrode 12 and a drain electrode 13, the gate electrode 12 being formed generally between the source and drain electrodes 11, 13. Typically, the electrodes are metal. The source electrode 11 has a tall profile compared to those of the gate and drain electrodes. Alternatively, the substrate 10 may comprise an end portion of having a greater thickness than the remainder of the substrate, whereby the source electrode 11 is located on the end portion having greater thickness. Fixed to a surface of the source electrode 11 is a carbon nanotube 14, the carbon nanotube 14 being in mechanical and electrical contact with the source electrode 11. The carbon nanotube 14 extends parallel to the substrate 10 and extends generally above the drain and gate electrodes 13, 12. The carbon nanotube 14 is mounted as a supported cantilever generally above the gate and drain electrodes 12, 13. A time-varying voltage applied to the gate electrode 12 causes oscillation of the carbon nanotube 14 in a direction generally parallel to the direction from the nanotube 14 to the substrate 10, as indicated by arrows A.

Figure 2:
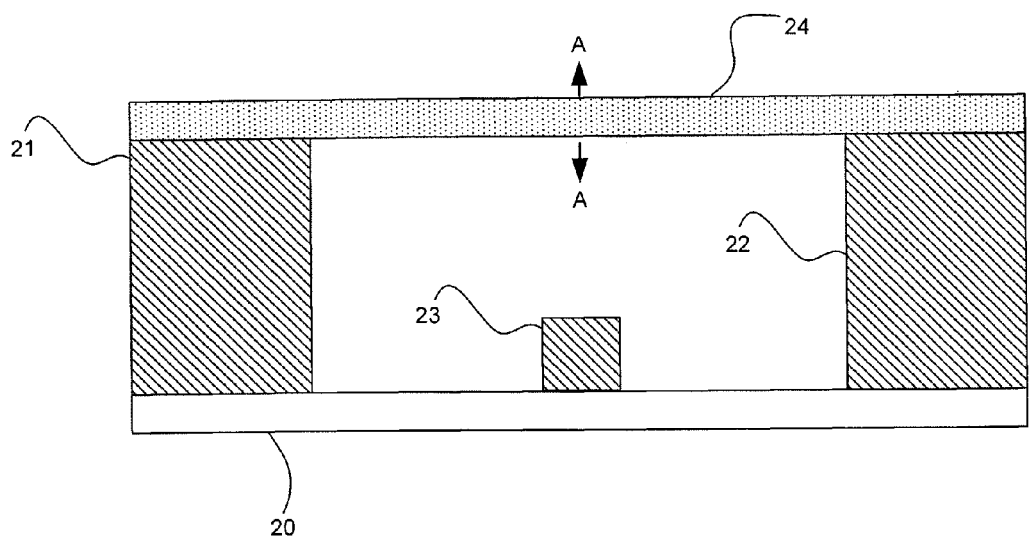
FIG. 2 is a schematic side-view of a doubly-clamped nanotube device.

FIG. 2 is a schematic side-view of a doubly-clamped nanotube device. The device comprises a substrate 20, upon which are formed a source electrode 21 and a drain electrode 22, each having the same profile. Also formed on the substrate is a gate electrode 23. The gate electrode 23 may have a relatively shorter profile than the source and drain electrodes 21, 22, and may be formed generally between the source and drain electrodes 21, 22. Fixed to an uppermost surface of the source electrode 21 is a first end portion of a carbon nanotube 24, the carbon nanotube 24 being in mechanical and electrical contact with the source electrode 21. Fixed to an uppermost surface of the drain electrode 22 is a second end portion of the carbon nanotube 24, the carbon nanotube 24 being in mechanical and electrical contact with the drain electrode 22. The source, drain and gate electrodes 21, 22, 23 are arranged on the substrate 20 such that a middle portion of the carbon nanotube 24 is suspended above the gate electrode 23. When an RF signal is applied to the gate electrode 23, oscillations of the nanotube 24, in a direction generally parallel to the direction from the nanotube 24 to the gate electrode 23, as indicated by arrows A, are induced. The oscillation of the nanotube 24 may be detected using capacitive transduction. Alternatively the nanotube 24 may act as a gate for a field-effect transistor or some other means of displacement detection.

It is known that one of the problems with the devices shown in FIGS. 1 and 2 is that of contact resistance between the metal electrodes in direct contact with the nanotube. The contact resistance between metals and carbon nanotubes is a result of Schottky Barrier behaviour caused by surface van Der Waals interactions which create an effective insulating layer between the surfaces of a metal and a nanotube. The theoretical minimum contact resistance between a single-walled carbon nanotube and a metal is $h/4e^2$ which is equal to about 6.5 KΩ. This can be reduced if the single-walled nanotube is replaced with a multi-walled nanotube, whereby the theoretical minimum is 6.5 kΩ/N, where N is the number of shells of the multi-walled nanotube in contact with the metal electrode. Currently, the best reported contacts between nanotubes and metals have a resistance in the region of 5 to 10 kΩ. (see. Applied Physics Letters 88 053118).

Figure 3:
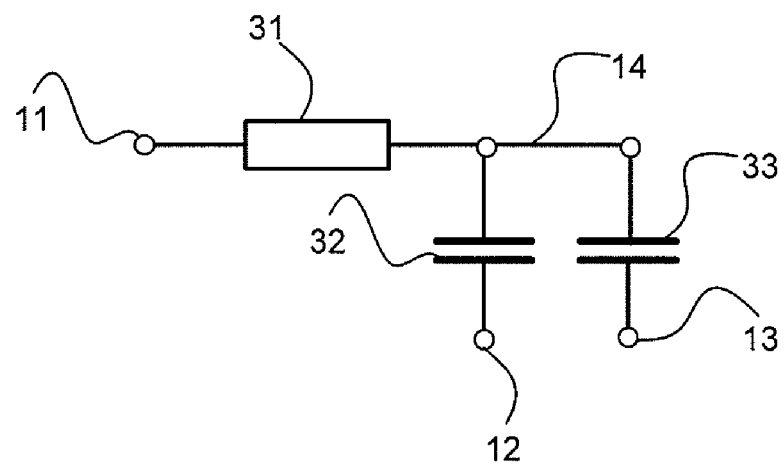
FIG. 3 is a circuit element to which the device of FIG. 1 can be approximated.

It is possible to approximate the device of FIG. 1 to a circuit element as shown in FIG. 3. The circuit element comprises the source electrode 11 in connection with a resistive element 31, the resistive element 31 being due to the contact resistance between the source electrode 11 and the nanotube 14. In connection with the resistive element 31 is the nanotube 14. In a parallel connection with the nanotube 14 is a first capacitive element 32, the first capacitive element 32 being due to a capacitive contact between the nanotube 14 and the gate electrode 12. In a series connection with the nanotube 14 is a second capacitive element 33, the second capacitive element 33 being due to the capacitive contact between the nanotube 14 and the drain electrode 13.

The capacitive elements 32, 33 arise as a result of a capacitive contact, due to the presence of insulating layers, between the nanotube 14 and the gate and drain electrodes 12, 13. The insulating layers result from the separation of the nanotube 14 and the gate and drain electrodes 12, 13.

Figure 4:
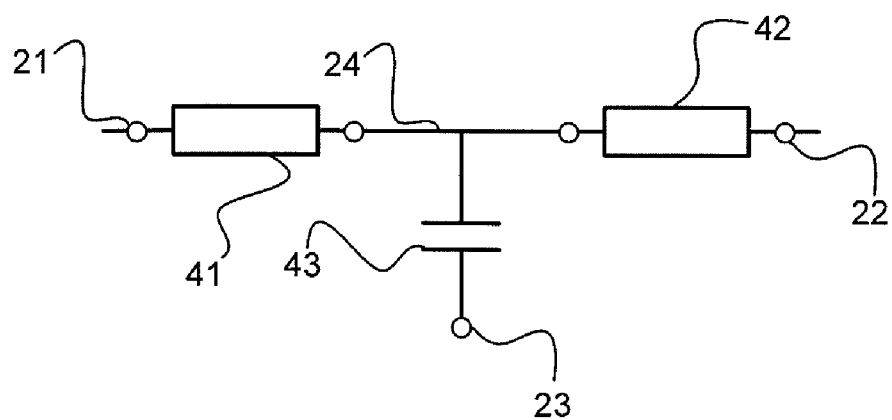
FIG. 4 is a circuit element to which the device of FIG. 2 can be approximated.

Similarly, it is possible to approximate the device of FIG. 2 to a circuit element as shown in FIG. 4. The circuit element comprises, connected in series, the source electrode 21, a first contact resistance 41 (due to the contact between the nanotube 24 and the source electrode 21), the nanotube 24, a second contact resistance 42 (due to the contact between the nanotube 24 and the drain electrode 22) and the drain electrode 22. The circuit element further comprises a capacitive element 43, connected in parallel to the nanotube 24, which arises from the capacitive contact between the nanotube 24 and the gate 23.

For electronic applications, contact resistances 31; 41, 42 are a serious drawback as they lead to losses. For resonator structures, such as these, where the tube performs mechanical oscillations at RF-frequencies this loss manifests itself not only as heat but also as mechanical damping, thereby significantly reducing the resonator Q-factor.

As the nanotube 14; 24 oscillates, in order to maintain charge equilibrium, an accompanying AC current flows through the contact resistance 31 (or resistances 41, 42). Typically electronic relaxation times of such a device (also known as the RC-time) are much smaller than the characteristic vibration period. Therefore, the electronic relaxation can be thought of as instantaneous on the time scale of mechanical motion. The dissipation caused by the AC current flowing through the contact resistance 31 (or resistances 41, 42) acts as a damping force on the nanotube 14; 24 motion and degrades the resonator Q factor.

Until now, efforts have primarily been focused on minimizing the contact resistance between the electrodes and the nanotube. However, as was discussed earlier, there is still a theoretical minimum contact resistance, which is yet to have been achieved, beyond which the contact resistance cannot be reduced.

Figure 5:
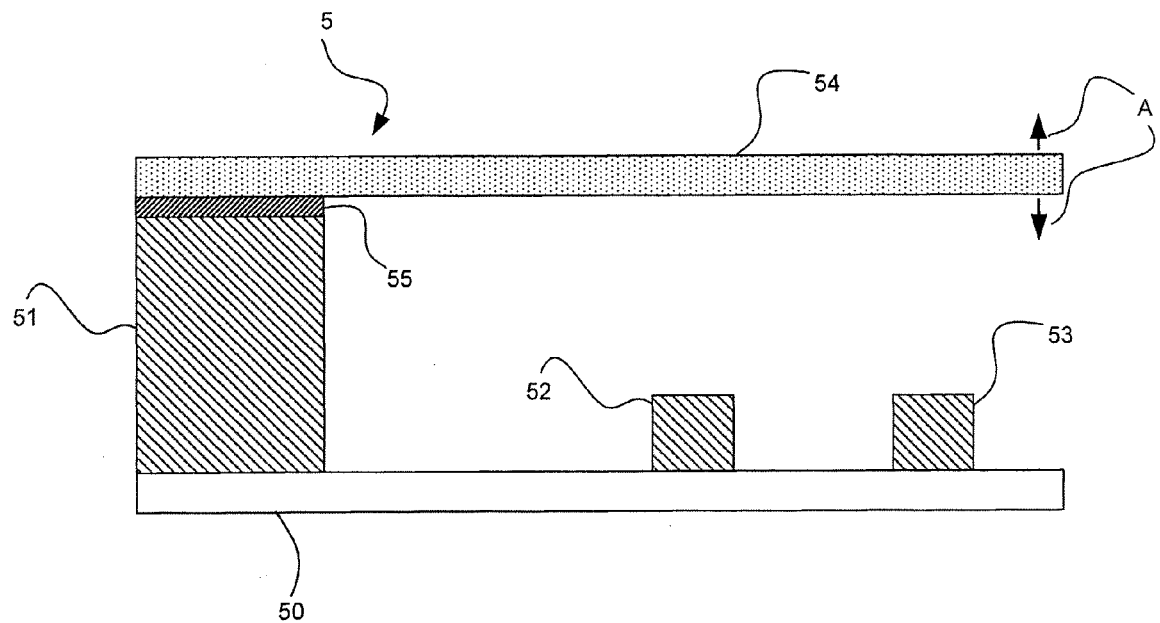
FIG. 5 is a schematic side-view of a first embodiment of the invention.

FIG. 5 is a schematic side-view of a singly-clamped nanotube device according to a first embodiment of the invention. The device 5 comprises a substrate 50, on which are formed a source electrode 51, a gate electrode 52 and a drain electrode 53, the gate electrode 52 being formed generally between the source and drain electrodes 51, 53. The substrate may comprise any non-conductive material upon which electrodes can be formed, such as high-resistive silicon. Typically, the electrodes are metal, generally one of aluminium, gold and copper. The heights of the gate and drain electrodes may be of the order of 10 nm, with the widths being approximately 50-100 nm. The source electrode 51 may have a relatively tall profile compared to those of the gate and drain electrodes 52, 53. Alternatively, the substrate 50 may comprise an end portion having a greater thickness than the remainder of the substrate, whereby the source electrode 51 is located on the end portion having greater thickness. Coupled to a surface of the source electrode is a layer of insulating material 55. Typically, this layer 55 may be a thin layer of solid insulating material, for example glass ($SiO_2$). Coupled to an opposite surface, to that coupled to the source electrode 51, of the layer of insulating material 55 is an end portion of a carbon nanotube 54. The carbon nanotube 54 extends parallel to the substrate 50 and extends generally above the drain and gate electrodes 53, 52. The carbon nanotube 54 may be approximately 10 nm above the gate and drain electrodes 52, 53. The carbon nanotube 54 is mounted as a supported cantilever generally above the gate and drain electrodes 52, 53. Typical carbon nanotube lengths are in the range of 0.1 μm-1 μm. Typically the carbon nanotubes are multi-walled nanotubes; however, both single walled nanotubes and clusters of attached nanotubes may also be used. A time-varying voltage applied to the gate electrode 52 causes oscillation of the carbon nanotube 54 in a direction generally parallel to the direction from the nanotube to the substrate, as indicated by arrows A.

According to this embodiment, the contact resistance, which usually exists between a metal and a nanotube, has been replaced by the layer of insulating material 55, thereby forming a capacitive contact between the source electrode 51 and the nanotube 54.

Figure 6A:
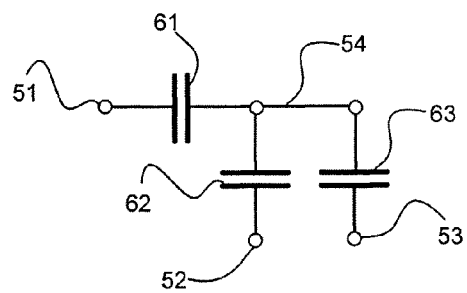
FIGS. 6a and 6b are circuit elements to which the device of FIG. 5 can be approximated.

The device 5 of FIG. 5 may be approximated to a circuit element as shown in FIG. 6a. The circuit element comprises the source electrode 51 in connection with a first capacitive element 61, the first capacitive element 61 being due to the capacitive contact between the source electrode 51 and the nanotube 54. In series connection with the first capacitive element 61 is the nanotube 54. In a parallel connection with the nanotube 54 is a second capacitive element 62, the second capacitive element 62 being due to a capacitive contact between the nanotube 54 and the gate electrode 52. In a series connection with the nanotube 54 is a third capacitive element 63, the third capacitive element 63 being due to the capacitive contact between the nanotube 54 and the drain electrode 53.

The first capacitive element 61 is formed as a result of capacitive contact between the source electrode 51 and the nanotube 54 via the thin layer of insulating material 55. The capacitive elements 62, 63 arise as a result of capacitive contact, due to the presence of an insulating layer, between the nanotube 54 and the gate and drain electrodes 52, 53. The insulating layer results from the separation of the nanotube 54 and the gate and drain electrodes 52, 53.

According to the first embodiment of the invention, the problems with Q-factor degradation as a result of dissipative loss are eliminated because the layer of insulating material 55, between the source electrode 51 and the nanotube 54, prevents dissipative currents from flowing.

Ideally, the capacitance of the first capacitive element 61, resulting from capacitive contact between the source electrode 51 and the nanotube 54 via the layer of insulating material 55, should be much greater than the capacitance of the second and third capacitive elements 62, 63. This may be achieved relatively easily because the capacitance of a capacitive element is as follows:

$$C \propto \frac{1}{d}$$

where d is the distance between an electrode 51, 52, 53 and the nanotube 54. Therefore, as the nature of the device requires the nanotube 54 to be significantly closer to the source electrode 51 than to the gate or drain electrodes 52, 53, the capacitance of the first capacitive element 61 naturally is significantly greater than the capacitances of the second an third capacitive elements 62, 63. The layer of insulating material may be as thin as possible so as to maximise capacitance, but thick enough so as to prevent electrical breakdown and tunnelling currents between the source electrode 51 and the nanotube 54. Typically, the thickness of the layer of insulating material is in the region of 5 nm.

Figure 6B:
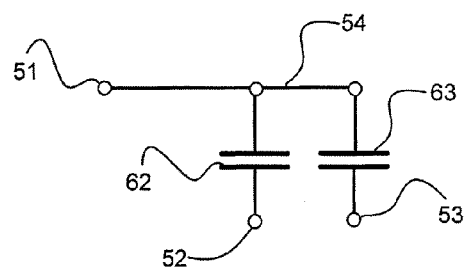

If the capacitance of the first capacitive element 61 is significantly greater than capacitances of the second and third capacitive elements 62, 63, which, as has been discussed, is generally the case, then the first capacitive element 61 acts as an effective short circuit for the source electrode 51 to nanotube 54 AC current. Therefore, in this situation, the device of FIG. 5 can be approximated further to the circuit diagram shown in FIG. 6b. The circuit comprises the source electrode 51 connected directly to the nanotube 54. In a parallel connection with the nanotube 54 is the second capacitive element 62, the second capacitive element 62 being due to a capacitive contact between the nanotube 54 and the gate electrode 52. In a series connection with the nanotube 54 is a third capacitive element 63, the third capacitive element 63 being due to the capacitive contact between the nanotube 54 and the drain electrode 53.

Figure 7:
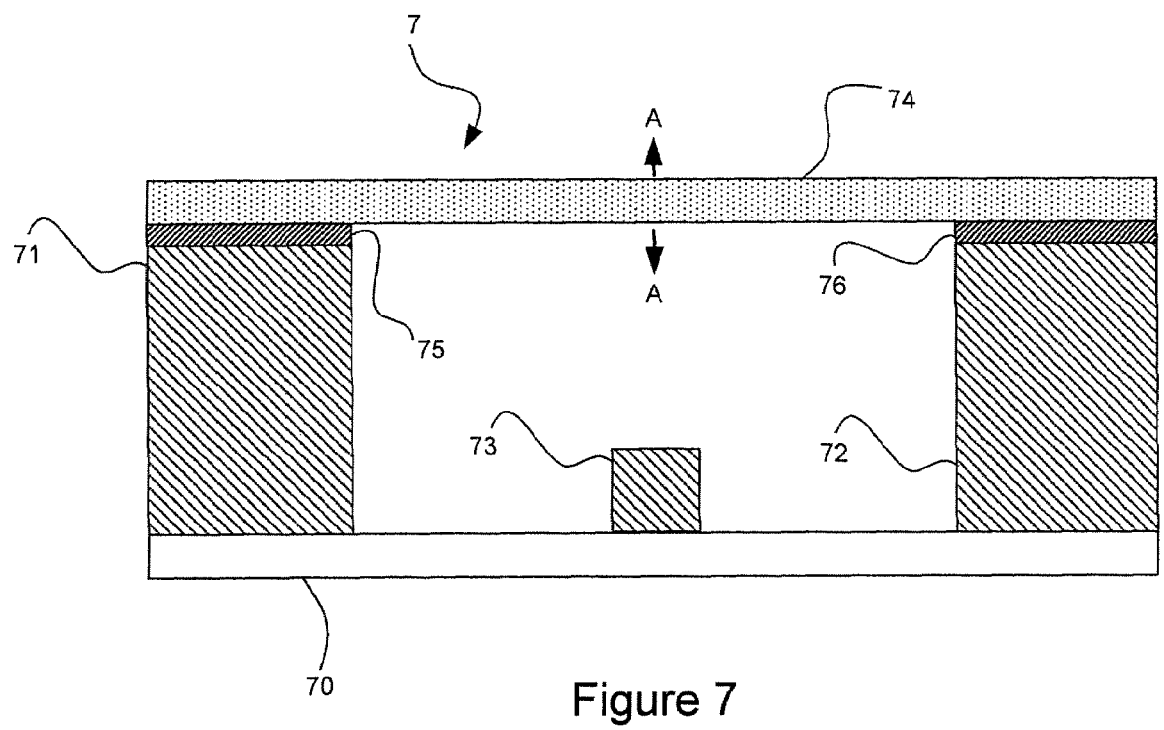
FIG. 7 is a schematic side-view of a second embodiment of the invention.

FIG. 7 shows a doubly-clamped nanotube device according to a second embodiment of the invention. The device 7 comprises a substrate 70, upon which are formed a source electrode 71 and a drain electrode 72, each having the same profile. Also formed on the substrate is a gate electrode 73. The gate electrode 73 may have a relatively shorter profile than the source and drain electrodes 71, 72, and may be formed generally between the source and drain electrodes 71, 72. The height of the gate electrode may be of the order of 10 nm, with the width being approximately 50-100 nm. Coupled to a surface of the source electrode 71 is a first layer of insulating material 75 and coupled to a surface of the drain electrode 72 is a second layer of insulating material 76. Typically, the first and second layers of insulating material 75, 76 may be thin layers of solid insulating material, for example glass ($SiO_2$). Coupled to an opposite surface, to that coupled to the source electrode 71, of the first layer of insulating material 75 is a first end portion of a carbon nanotube 74. Coupled to an opposite surface, to that coupled to the drain electrode 72, of the first layer of insulating material 76 is a second end portion of the carbon nanotube 74. The source, drain and gate electrodes 71, 72, 73 are arranged on the substrate 70 such that a middle portion of the carbon nanotube 74 is suspended generally above the gate electrode 73. When an RF signal is applied to the gate electrode 73, oscillations of the nanotube, in a direction generally parallel to the direction from the nanotube 74 to the gate electrode 73, as indicated by arrows A, are induced.

Figure 8A:
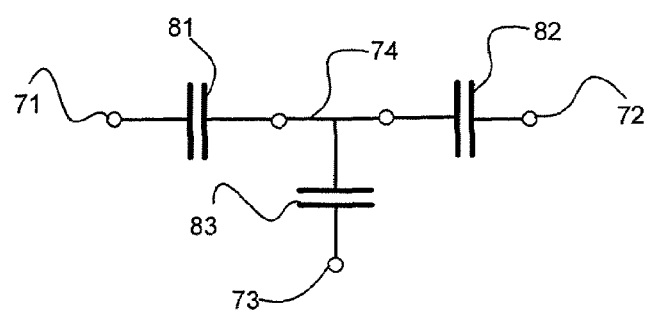
FIGS. 8a and 8b are circuit elements to which the device of FIG. 7 can be approximated.

The device 7 of FIG. 7 may be approximated to a circuit element as shown in FIG. 8a. The circuit element comprises, connected in series, the source electrode 71, a first capacitive element 81, the first capacitive element 81 being due to the capacitive contact between the source electrode 71 and the nanotube 74, the nanotube 74, a second capacitive element 82, the second capacitive element 82 being due to the capacitive contact between the drain electrode 72 and the nanotube 74, and finally the drain electrode 72. In parallel connection with the nanotube 74 is a third capacitive element 83, the third capacitive element 83 being due to the capacitive contact between the gate electrode 73 and the nanotube 74.

As with the singly-clamped nanotube device 5 according to the first embodiment of the invention, the doubly-clamped nanotube device 7 of FIG. 7 can be further approximated from the circuit elements of FIG. 8a, if the relative capacitances of the first, second and third capacitive elements 81, 82, 83 are correct. In this case, if the capacitances of both the first and second capacitive elements 81, 82 are significantly greater than the capacitance of the third capacitive element 83, the first and second capacitive elements 81, 82 act as effective short circuits for an AC current. This further approximation of the device 7 of FIG. 7 can be seen in FIG. 8b.

Figure 8B:
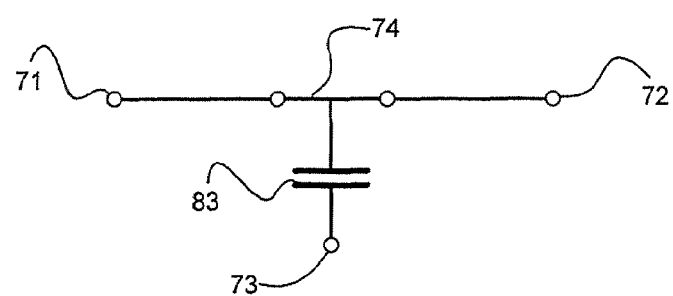

The circuit elements shown in FIG. 8b comprise, connected in series, the source electrode 71, the nanotube 74 and the drain electrode 72. In a parallel connection with the nanotube 74 is the third capacitive element 83, the third capacitive element 83 being due to a capacitive contact between the nanotube 74 and the gate electrode 73.

As with the first embodiment, by effectively eliminating the contact resistance between the metal electrodes and the nanotube, the energy loss through dissipation is dramatically reduced. As such the mechanical damping is lower and the Q-factor of the device is very high.

The first and second embodiments not only provide the advantage of effectively eliminating the problems associated with contact resistance between metal electrodes and nanotubes, but potentially also enable higher precision during the fabrication of the devices. This is because the contact resistance between a metal and a nanotube is typically a hard parameter to control during fabrication of such a device. With a purely capacitive contact, on the other hand, the main parameters determining the capacitance are the thickness and length of the insulating layer, which generally is easier to control.

Figure 9:
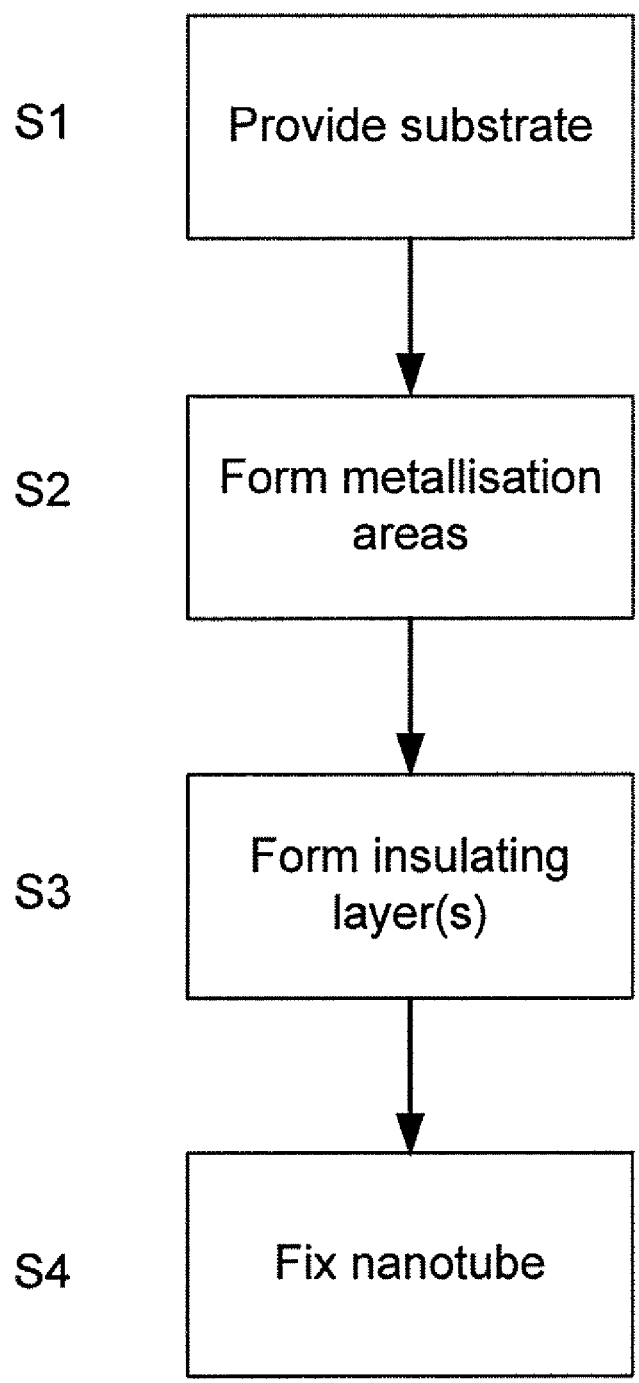
FIG. 9 is a flow chart illustrating a method of producing the devices of FIGS. 5 and 7.

A method of making the device 5 of FIG. 5 will now be described with reference to FIG. 9.

The first step, Step S1, is to provide the substrate 50. At Step S2, the metallisation areas 51, 52, 53 are formed on the substrate 50. This can be carried out in any suitable manner. This step provides source, gate and drain electrodes 51, 52, 53 on the substrate 50. The gate electrode 52 is located between the source and drain electrodes 51, 53. The height of the source electrode 51 from the surface of the substrate 50 may be greater than the heights of the gate and drain electrodes 52, 53. Alternatively, the substrate may comprise an end portion of the substrate having a greater thickness than the remainder of the substrate, whereby the source electrode is located on the end portion having greater thickness. At Step S3, a layer of insulating material 55 is formed in contact with a surface of the source electrode 51. The length and thickness of the insulating layer may be predetermined depending on the capacitance required. At Step S4, a carbon nanotube 54 is fixed to the opposite surface of the layer of insulating material 55 to that in contact with the source electrode 51. The carbon nanotube 54 is fixed such that its length extends generally above the gate and drain electrodes 52, 53. Typically, the nanotubes are grown elsewhere and are floated on a liquid to above the desired fixing site and aligned using an electric field. When they are correctly positioned, the liquid is evaporated away. Alternatively, the nanotubes may be grown in situ. According to one growth process, a seed for the nanotube is provided at the relevant location on the surface of the layer of insulating material 55. The seeds are catalyst particles. Good catalyst particles are Iron (Fe) particles, although other seeds may also be suitable. The carbon nanotube 54 is then formed from the seeds using chemical vapour deposition (CVD).

A method of making the device 7 of FIG. 7 will now be described, also with reference to FIG. 9.

The first step, Step S1, is to provide the substrate 70. At Step S2, the metallisation areas 71, 72, 73 are formed on the substrate 70. This can be carried out in any suitable manner. This step provides source, drain and gate electrodes 71, 72, 73 on the substrate 70. The source electrode 71 and the drain electrode 72 may have the same profile, their profile being relatively taller than that of the gate electrode 73. The gate electrode 73 may be formed generally between the source and drain electrodes 71, 72. At Step S3, the first layer of insulating material 75 is formed in contact with a surface of the source electrode 71 and the second layer of insulating material 76 is formed in contact with a surface of the drain electrode 72. The lengths and thicknesses of the insulating layers may be predetermined depending on the capacitance required. At Step S4, a first end portion of a carbon nanotube 74 is fixed to the opposite surface of the first layer of insulating material 75 to that in contact with the source electrode 71 and a second end portion of the carbon nanotube 74 is fixed to the opposite surface of the second layer of insulating material 76 to that in contact with the drain electrode 72. The carbon nanotube 74 is arranged such that a middle portion, between the first and second end portions is raised above the gate electrode 73 and thus bridges a gap between the locations on the substrate 70 of the source and drain electrodes 71, 72. The carbon nanotube may be grown elsewhere and positioned and fixed using the technique described earlier. Alternatively, they may be grown in situ.

Figure 10:
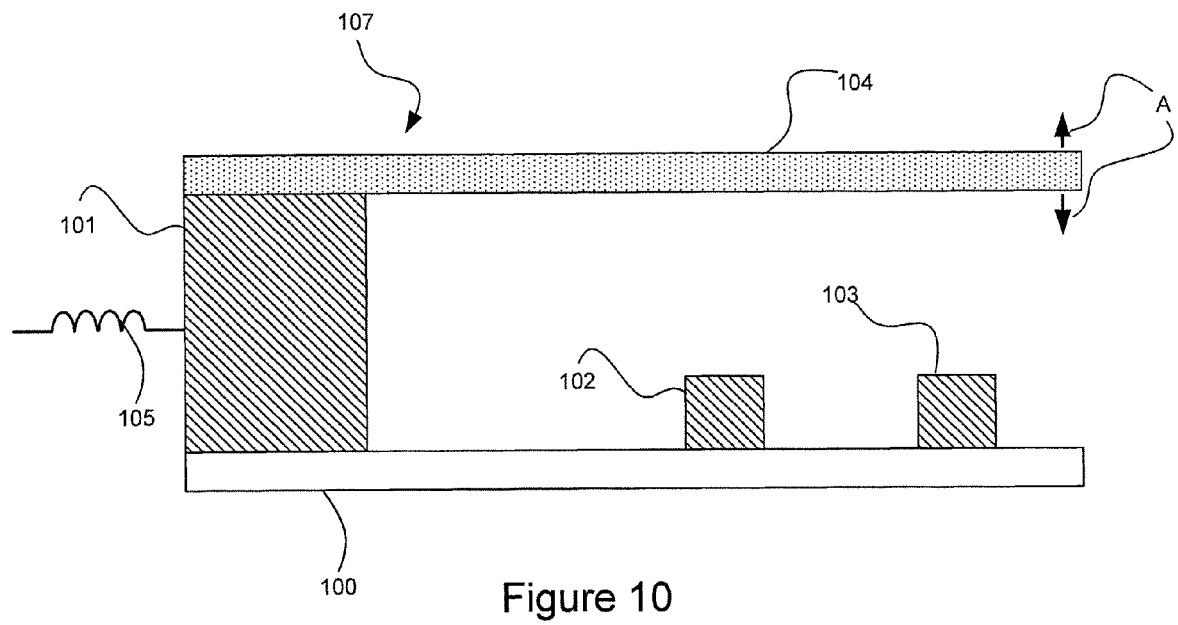
FIG. 10 is a schematic side-view of a third embodiment of the invention.

FIG. 10 is a schematic side-view of a nanotube device according to a third embodiment of the invention. The device comprises a substrate 100, on which are formed a source electrode 101, a gate electrode 102 and a drain electrode 103, the gate electrode 102 being formed generally between the source and drain electrodes 101, 103. Typically, the electrodes are metal. The source electrode 101 may have a relatively tall profile compared to those of the gate and drain electrodes 102, 103. Alternatively, the substrate 100 may comprise an end portion having a greater thickness than the remainder of the substrate, whereby the source electrode 101 is located on the end portion having greater thickness. Fixed to a surface of the source electrode 101 is a carbon nanotube 104, the carbon nanotube 104 being in mechanical and electrical contact with the source electrode 101. The carbon nanotube 104 extends parallel to the substrate 100 and extends generally above the drain and gate electrodes 103, 102. The carbon nanotube 104 is mounted as a supported cantilever generally above the gate and drain electrodes 102, 103. A time-varying voltage applied to the gate electrode 102 causes oscillation of the carbon nanotube 104 in a direction generally parallel to the direction from the nanotube to the substrate 100, as indicated by arrows A. Connected in series to the source electrode 101 is an inductive element 105.

Figure 11:
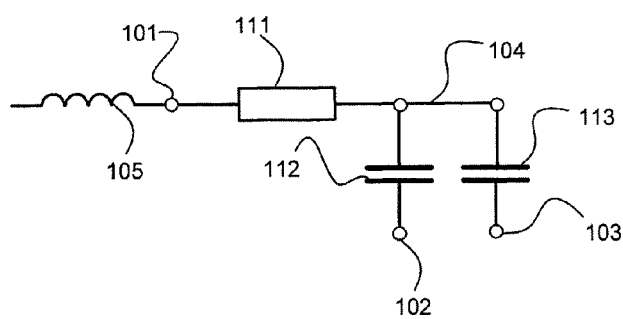
FIG. 11 is a circuit element to which the device of FIG. 10 can be approximated.

The device of FIG. 10 may be approximated to a circuit element as shown in FIG. 11. The circuit element comprises, connected in series, the inductive element 105, the source electrode 101, a resistive element 111, the resistive element being due to the contact resistance between the source electrode 101 and the nanotube 104, and the nanotube 104. In a parallel connection with the nanotube 104 is a first capacitive element 112, the first capacitive element 112 being due to a capacitive contact between the nanotube 104 and the gate electrode 102. In a series connection with the nanotube 104 is a second capacitive element 113, the second capacitive element 113 being due to the capacitive contact between the nanotube 104 and the drain electrode 103.

When the nanotube oscillates, the AC currents which usually flow in the resistive contact 111, and therefore dissipate heat, are opposed by the inductive element 105. This is because the time constant of the inductive element 105 is much greater than the time period of the AC signal. The result, therefore, is that very minimal alternating current flows through the resistive contact 111 and thus the energy dissipation and the Q-factor degradation, due to the presence of the resistive contact 111 between source electrode 101 and the nanotube 104, are reduced.

Figure 12:
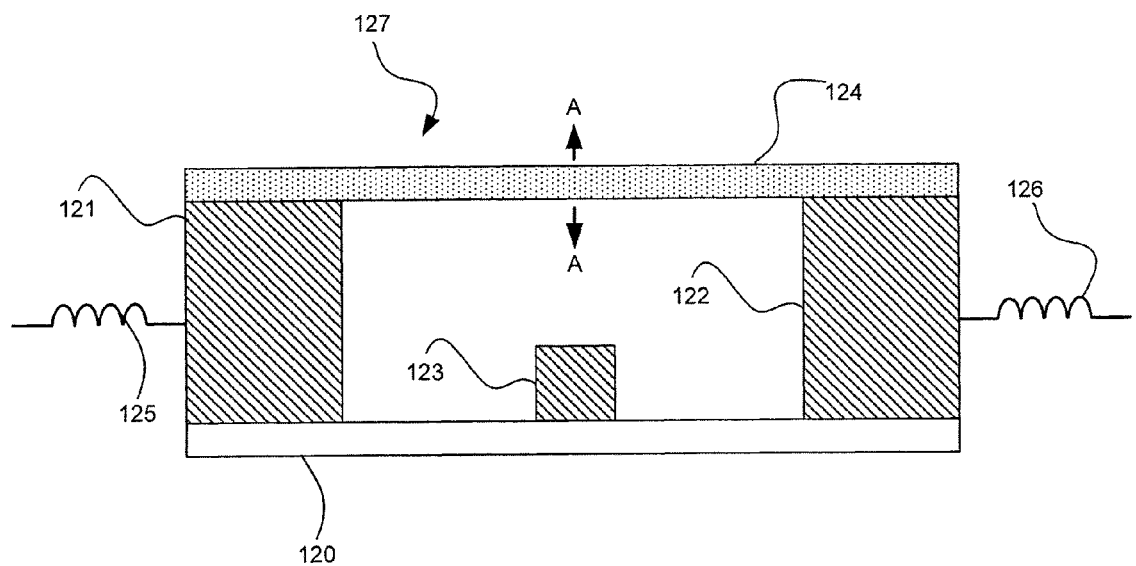
FIG. 12 is a schematic side-view of a fourth embodiment of the invention.

FIG. 12 shows a nanotube device according to a fourth embodiment of the invention. The device 127 comprises a substrate 120, upon which are formed a source electrode 121 and a drain electrode 122, each having the same profile. A gate electrode 123 may also be formed on the substrate 120. The gate electrode 123 may have a relatively shorter profile than the source and drain electrodes 121, 122, and may be formed generally between the source and drain electrodes 121, 122. Coupled to an uppermost surface of the source electrode 121 is a first end portion of a carbon nanotube 124. Coupled to an uppermost surface of the drain electrode 122 is a second end portion of the carbon nanotube 124. The source and drain electrodes 121, 122 are arranged on the substrate 120 such that a middle portion of the carbon nanotube 124 is suspended above the gate electrode 123. In series connection with the source electrode is a first inductive element 125 and in series connection with the drain electrode 122 is a second inductive element 126. Oscillations of the nanotube 124, in a direction generally parallel to the direction from the nanotube 124 to the gate electrode 123 as indicated by arrows A, may be detected using capacitive transduction. Alternatively, the nanotube 124 may act as a gate for a field-effect transistor or some other means of displacement detection.

A device according to the fourth embodiment may be suitable for use when a DC-component is required through the nanotube device.

Figure 13:
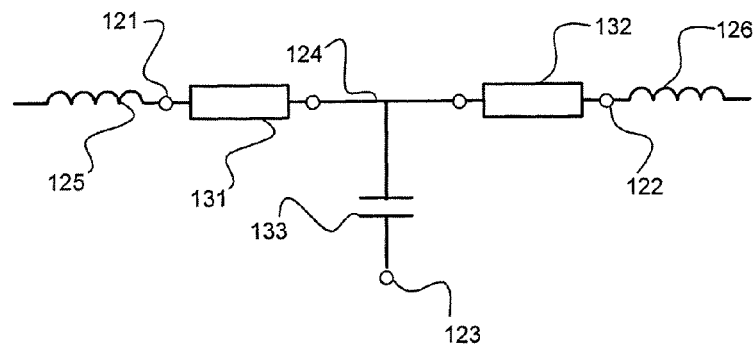
FIG. 13 is a circuit element to which the device of FIG. 12 can be approximated.

The device of FIG. 12 may be approximated to a circuit element as shown in FIG. 13. The circuit element of FIG. 13 comprises, connected in series, the inductive element 125, the source electrode 121, a first resistive element 131 (due to the contact resistance between the nanotube 124 and the source electrode 121), the nanotube 124, a second resistive element 132, (due to the contact resistance between the nanotube 124 and the drain electrode 122), the drain electrode 122, and a second inductive element 126. The circuit element further comprises a capacitive element 133 and the gate electrode 123, connected in parallel to the nanotube 124, the capacitive element 113 arising as a result of the capacitive contact between the nanotube 124 and the gate electrode 123.

As with the third embodiment of the invention, when the nanotube oscillates, the AC currents which usually flow in the resistive contacts 131, 132 are opposed by the corresponding inductive elements 125, 126. This is, again, because the time constants of the inductive elements 125, 126 are much greater than the time period of the AC signal. The result, therefore, is that the net alternating current that flows through the resistive contacts 131, 132 are greatly reduced and thus the energy dissipation and the Q-factor degradation, due to the presence of the resistive contacts between electrodes and the nanotube, are also greatly reduced.

It should be understood that many of relevant dimensions and materials specified with reference to the first and second embodiments of the invention are also relevant with regard to the third and fourth embodiments of the invention.

A method of making the device 107 of FIG. 10 will now be described with reference to FIG. 12.

The first step, Step P1, is to provide the substrate 100. At Step P2, the metallisation areas 101, 102, 103 are formed on the substrate 100. This can be carried out in any suitable manner. This step provides source, gate and drain electrodes 101, 102, 103 on the substrate 100. The gate electrode 102 is located between the source and drain electrodes 101, 103. The height of the source electrode 101 from the surface of the substrate 100 may be greater than the heights of the gate and drain electrodes 102, 103. Alternatively, the substrate may comprise an end portion of the substrate having a greater thickness than the remainder of the substrate, whereby the source electrode is located on the end portion having greater thickness. At Step P3, the first inductive element 105 is coupled to the source electrode 101. The first inductive element 105 may be coupled to the source electrode 101 in series. At Step P4, a carbon nanotube 104 is fixed such that an end portion of the carbon nanotube 104 is in mechanical and electrical contact with a surface of the source electrode 101. The carbon nanotube 104 is fixed such that its length extends generally above the gate and drain electrodes 102, 103. The carbon nanotube may be grown elsewhere and positioned and fixed using the technique described previously. Alternatively, they may be grown in situ.

Figure 14:
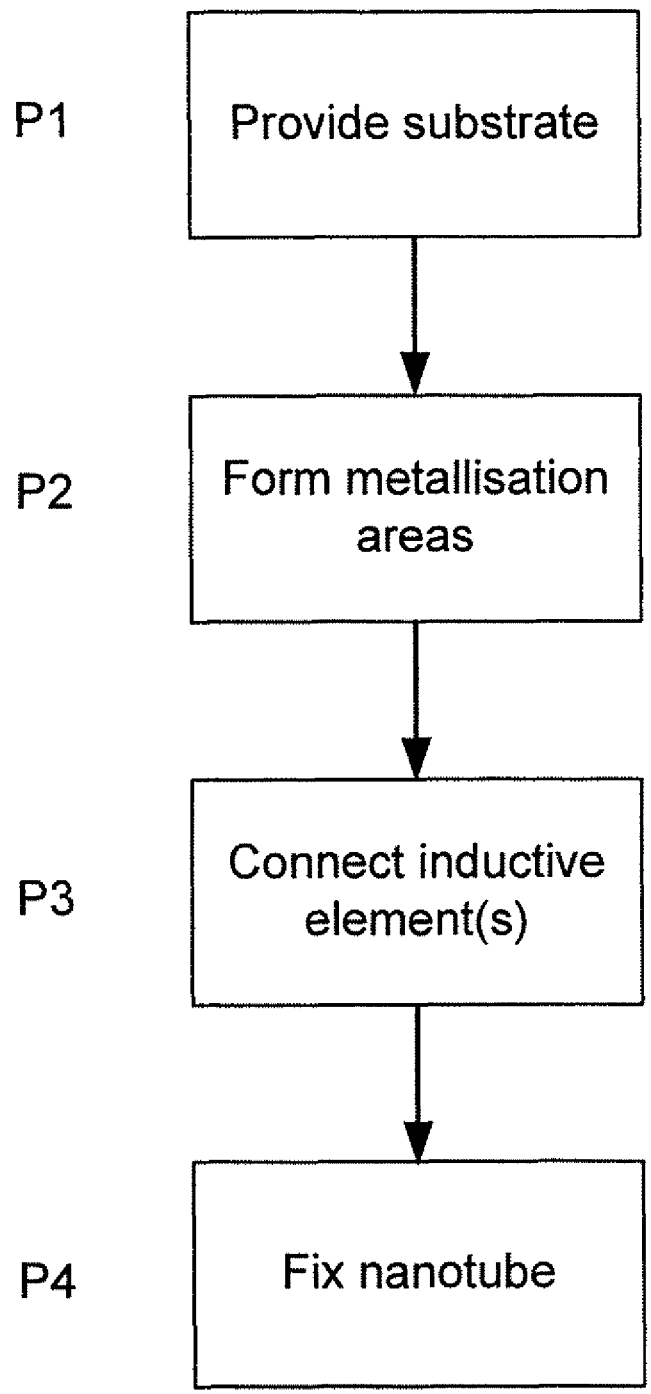
FIG. 14 is a flow chart illustrating a method of producing the devices of FIGS. 10 and 12.

A method of making the device 127 of FIG. 12 will now be described, also with reference to FIG. 14.

The first step, Step P1, is to provide the substrate 120. At Step P2, the metallisation areas 121, 122, 123 are formed on the substrate 120. This can be carried out in any suitable manner. This step provides source, drain and gate electrodes 121, 122, 123 on the substrate 120. At Step P3, a first inductive element 125 is coupled to the source electrode 121 and a second inductive element 126 is coupled to the drain electrode 122. The first and second inductive elements 125, 126 may be coupled to the source and drain electrodes 121, 122 in series. At Step P4, a carbon nanotube 124 is fixed such that a first end portion of a carbon nanotube 124 is in mechanical and electrical contact with a surface of the source electrode 121 and an opposite second end of the carbon nanotube 124 is in mechanical and electrical contact with the surface of the drain electrode 122. The carbon nanotube 124 is arranged such that a middle portion, between the first and second end portions is raised above the gate electrode 123 and thus bridges a gap between the locations on the substrate 120 of the source and drain electrodes 121, 122. The carbon nanotube may be grown elsewhere and positioned and fixed using the technique described previously. Alternatively, they may be grown in situ.

Figure 15:
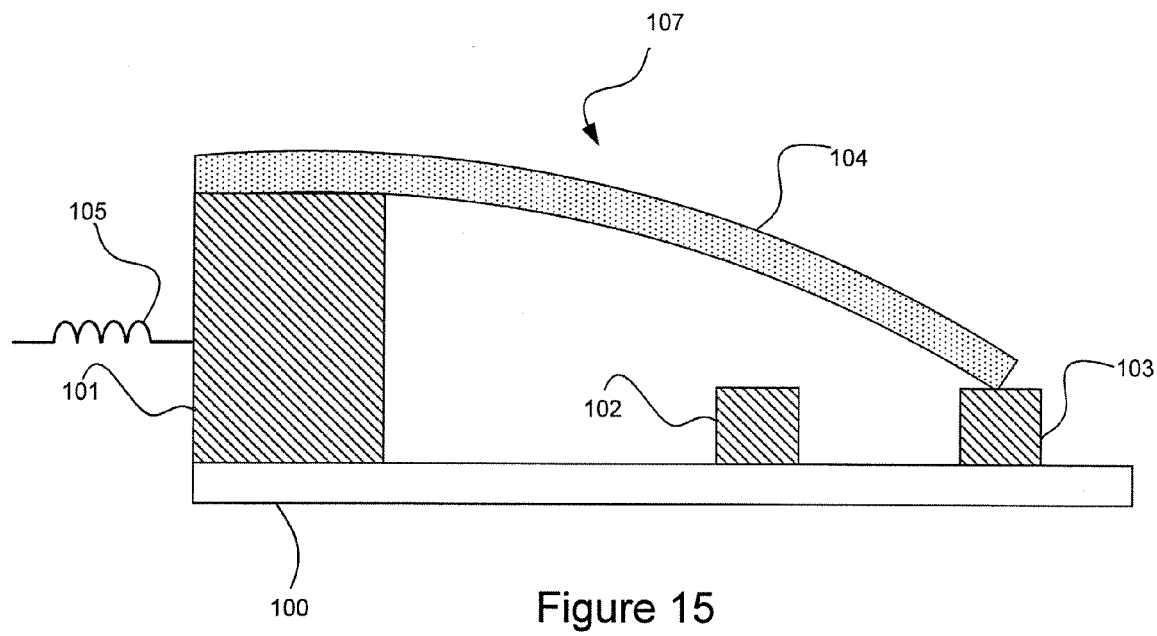
FIG. 15 is a schematic side-view of the third embodiment of the invention experiencing stiction.
Figure 16:
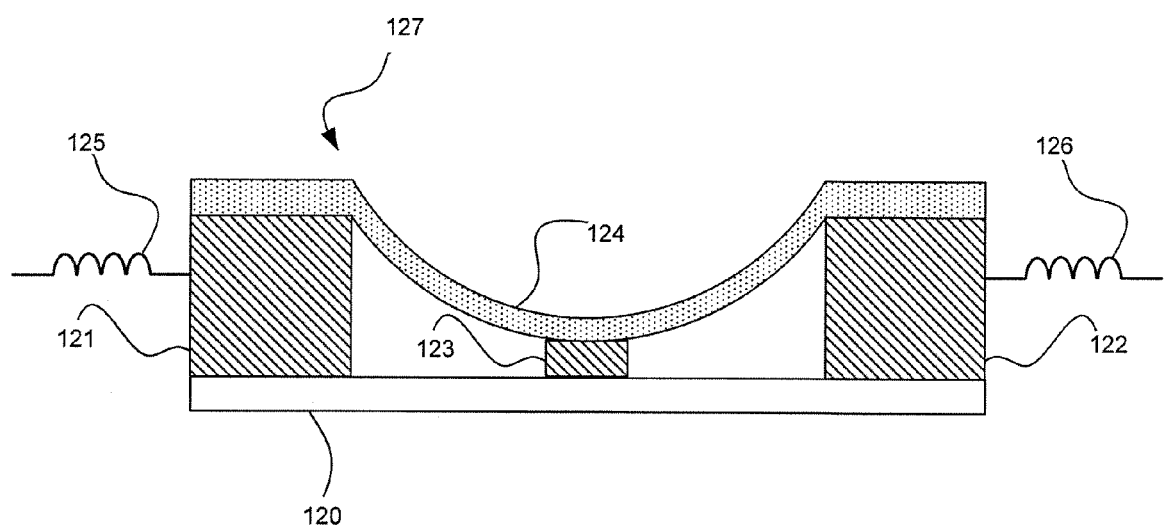
FIG. 16 is a schematic side-view of a fourth embodiment of the invention experiencing stiction.

According to the third and fourth embodiments of the invention, an advantage of counteracting stiction may also be achieved. Stiction may occur when the oscillation of the nanotube causes it to come within a certain distance of an electrode, the certain distance being the distance at which the surface forces between the nanotube and the electrode override other forces. This may result in the nanotube becoming permanently stuck to the electrode. The devices 107, 127 of FIGS. 10 and 12 are depicted experiencing stiction depicted in FIGS. 15 and 16 respectively. In FIG. 15, the nanotube 104 is stuck to the drain electrode 103, while in FIG. 16 the nanotube 124 is stuck to the gate electrode 123. With a purely resistive contact between the source electrode and the nanotube (i.e. without the series coupled inductive element(s)), the charge relaxation time for the electronic subsystem is typically much shorter than the time scale for mechanical motion. This means that, even if a large positive bias is put on the contacted electrode (the electrode to which the nanotube is stuck), the force between the nanotube and the contacted electrode remains attractive. However, by coupling an inductive element 105; 125 in series with the source electrode 101; 121, as is shown in FIGS. 10 and 12 (and FIGS. 15 and 16), the charge relaxation time can be increased by several orders of magnitude. This results in the positive charge on the nanotube remaining even if the voltage applied to the contacted electrode is raised. Therefore, if a reverse voltage pulse is applied to the contacted electrode in a time shorter than the relaxation time of the electronic subsystem, a repulsive force acting between the contacted electrode and the nanotube may result, and the release of the nanotube from the contacted electrode may be achieved. It should be noted, with reference to FIG. 16, that the advantage of counteracting stiction may also be achieved if only one of the first inductive element 125 and the second inductive element 126 was included in the device of FIG. 11 or 13, with the other being omitted.

As with many electromechanical systems, the devices according to any one of the embodiments of the invention (as depicted in FIGS. 5, 7, 10 and 12) have a resonant frequency. The resonant frequency varies according to the length and stiffness of the nanotube. Multi-walled nanotubes or clusters of nanotubes are generally stiffer than single-walled nanotubes and can therefore be longer than single nanotubes having the same resonant frequency. Generally, obtainable resonant frequencies are in the range 1 to 5 GHz. The resonant frequency is tuneable using a voltage bias applied to the gate electrode. As such, the devices are usable as tuneable filters, wherein if the gate voltage is modulated with an RF signal containing several frequency components, the frequency components with frequencies out of resonance are suppressed. Therefore, only those components of the signal which match the resonant frequency pass.

Figure 17:
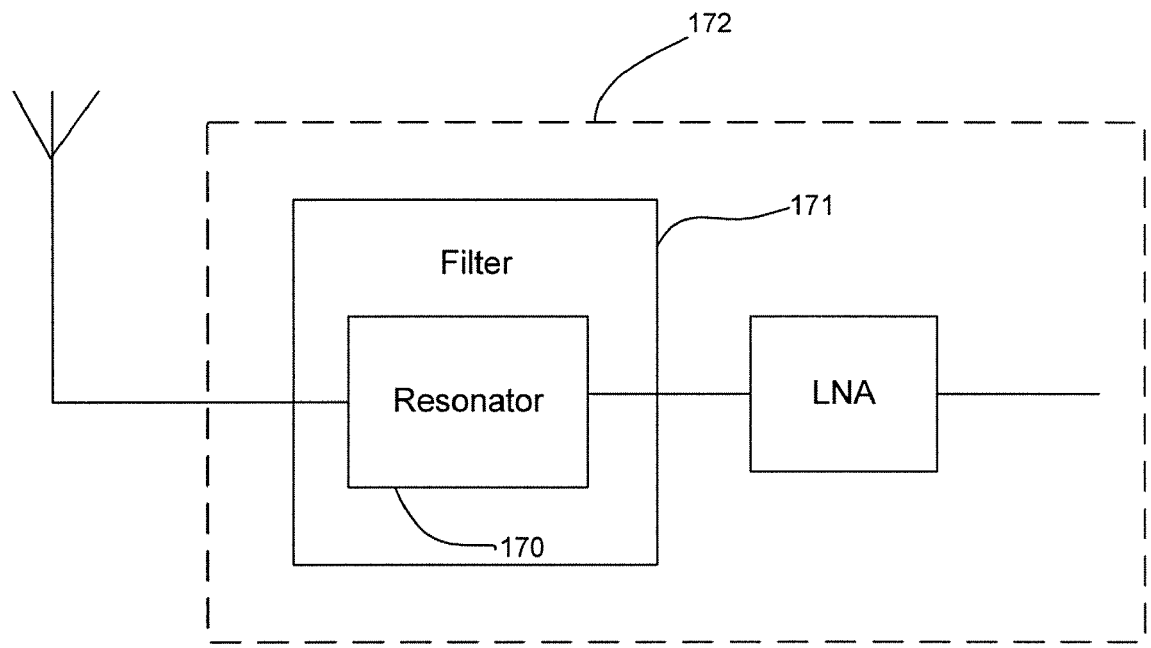
FIG. 17 is a diagram illustrating a radio receiver incorporating the devices of either of FIG. 5, 7, 10 or 12.

As shown in FIG. 17, the resonator 170, which may comprise any one of devices 5, 7, 107, 127, and controllable voltage bias circuitry (not shown) is included as part of filter 171 of an RF front end of a radio receiver, in this example a radio transceiver 172.

A filter incorporating any one of the devices 5, 7, 107, 127 can also be used in a front end of RF transmitter, that is, between the power amplifier and the antenna.

By using any of the devices according to any one of the embodiments of the invention in the resonator 170, the resonator 170 can be a very high quality, or high-Q, resonator. These capabilities derive from the physical arrangement of the devices 5, 7, 107, 127 as shown in FIGS. 5, 7, 10 and 12. The resonator 170 is suitable for forming an essential component in software-defined and cognitive radio hardware.

The devices 5, 7, 107, 127 of FIGS. 5, 7, 10 and 12 have a number of other potential applications.

Figure 18:
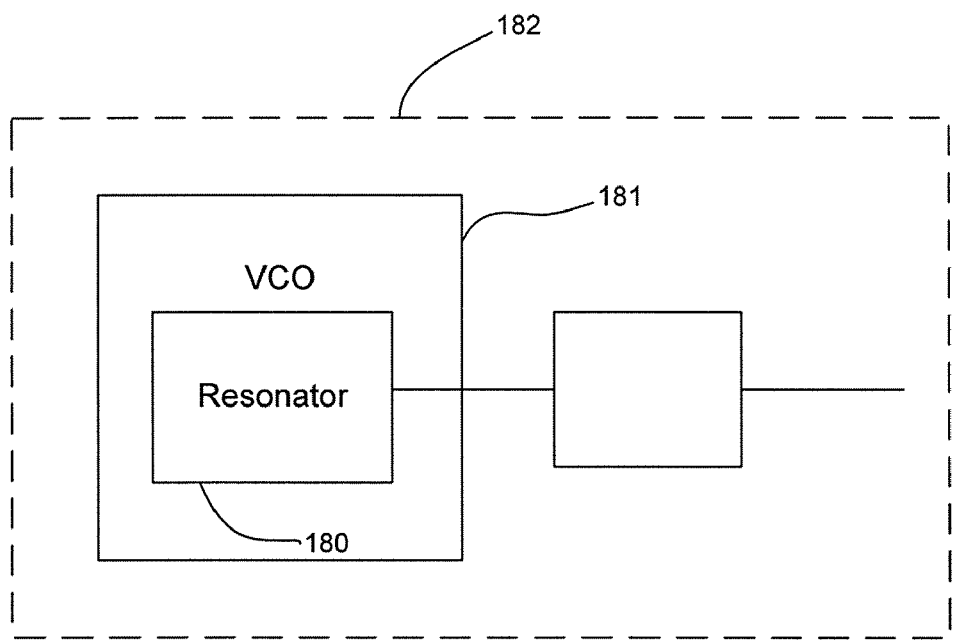
FIG. 18 is a diagram illustrating an alternative radio receiver incorporating the devices of either of FIG. 5, 7, 10 or 12.

For instance, the devices can also be used as resonators 180 in a voltage-controlled oscillator (VCO) 181. This is shown in FIG. 18. This kind of VCO is an integral part of a radio synthesizer. The potentially wide tuning range and high quality factor of the resonator device of the invention enable low phase noise synthesizers operating at several RF bands with only a single core VCO.

The VCO can be tuned by varying the bias voltages applied to the gate electrodes as will be appreciated from the above explanation.

As shown in FIG. 18, the resonator 180, which comprises any one of the devices 5, 7, 107, 127 and controllable voltage bias circuitry (not shown) is included as part of VCO 181 of a radio receiver, in this example a radio transceiver 182.

The invention claimed is:

1. A device comprising a nanotube configured as a resonator, a source electrode, a gate electrode, and a drain electrode, wherein a first end portion of the nanotube is fixed to the source electrode via an interposed layer of solid insulating material.

2. A device according to claim 1, wherein the nanotube, the source electrode, the gate electrode and the drain electrode are arranged such that a second end portion of the nanotube extends from the source electrode generally above the gate electrode and the drain electrode.

3. A device according to claim 2, wherein the nanotube is in first capacitive contact with the source electrode, in second capacitive contact with the gate electrode and in third capacitive contact with the drain electrode, wherein the capacitance of the first capacitive contact is greater than the capacitance of the second and third capacitive contacts.

4. A device according to claim 1, wherein the first end portion of the nanotube is fixed to the source electrode via a first layer of solid insulating material and a second end portion of the nanotube is fixed to the drain electrode via a second layer of interposed solid insulating material.

5. A device according to claim 4, wherein the nanotube, the source electrode, the gate electrode and the drain electrode are arranged such that a middle portion of the nanotube, between the first and second end portions, bridges a gap between the source electrode and the drain electrode, the middle portion of the nanotube being positioned generally above the gate electrode.

6. A device according to claim 4, wherein the nanotube is in first capacitive contact with the source electrode, in second capacitive contact with the gate electrode and in third capacitive contact with the drain electrode, wherein the capacitances of the first capacitive contact and the third capacitive contact are greater than the capacitance of the second capacitive contact.

7. A device according to claim 1, wherein the source electrode, the gate electrode and the drain electrode are located on a surface of a substrate.

8. A device according to claim 1, wherein the gate electrode is located generally between the source electrode and the drain electrode.

9. A device according to claim 1, wherein the device has a resonant frequency, the resonant frequency being changeable by applying a bias voltage to the gate electrode.

10. A tuneable filter comprising a device according to claim 1.

11. A voltage controlled oscillator comprising a device according to claim 1.

12. A mobile terminal comprising a device according to claim 1.

13. A device comprising a nanotube configured as a resonator, a source electrode, a gate electrode, a drain electrode and at least one reactive element, wherein the at least one reactive element is configured to minimize energy loss due to a contact resistance between at least the source electrode and the nanotube, and wherein the at least one reactive element consists of one or more capacitive elements, or one or more inductive elements.

14. A device according to claim 13, wherein the source electrode, the gate electrode and the drain electrode are located on a surface of a substrate.

15. A device according to claim 13, wherein the gate electrode is located generally between the source electrode and the drain electrode.

16. A device according to claim 13, wherein the device has a resonant frequency, the resonant frequency being changeable by applying a bias voltage to the gate electrode.

17. A tuneable filter comprising a device according to claim 13.

18. A voltage controlled oscillator comprising a device according to claim 13.

19. A mobile terminal comprising a device according claim 13.

20. A device comprising a nanotube configured as a resonator, a source electrode, a gate electrode, a drain electrode and at least one impeding element, wherein the at least one impeding element is configured to minimize energy loss due to a contact resistance between at least the source electrode and the nanotube, wherein the impeding element comprises a layer of solid insulating material and a first end portion of the nanotube is fixed to the source electrode via the layer of solid insulating material, the layer of solid insulating material being interposed between the nanotube and the source electrode.

21. A device according to claim 20, wherein the nanotube, the source electrode, the gate electrode and the drain electrode are arranged such that a second end portion of the nanotube extends from the source electrode above the gate electrode and the drain electrode.

22. A device according to claim 20, wherein the nanotube is in first capacitive contact with the source electrode, in second capacitive contact with the gate electrode and in third capacitive contact with the drain electrode, wherein the capacitance of the first capacitive contact is greater than the capacitance of the second and third capacitive contacts.

23. A device comprising a nanotube configured as a resonator, a source electrode, a gate electrode, a drain electrode and at least one impeding element, wherein the at least one impeding element is configured to minimize energy loss due to a contact resistance between at least the source electrode and the nanotube, wherein the at least one impeding element comprises a first layer of solid insulating material and a second layer of solid insulating material, and wherein a first end portion of the nanotube is fixed to the source electrode via the first layer of solid insulating material, the first layer of insulating material being interposed between the first end portion of the nanotube and the source electrode, and a second end portion of the nanotube is fixed to the drain electrode via the second layer of solid insulating material, the second layer of insulating material being interposed between the second end portion of the nanotube and the drain electrode.

24. A device according to claim 23, wherein the nanotube, the source electrode, the gate electrode and the drain electrode are arranged such that a middle portion of the nanotube, between the first and second end portions, bridges a gap between the source electrode and the drain electrode, the middle portion of the nanotube being positioned generally above the gate electrode.

25. A device according to claim 23, wherein the nanotube is in first capacitive contact with the source electrode, in second capacitive contact with the gate electrode and in third capacitive contact with the drain electrode, wherein the capacitances of the first capacitive contact and the third capacitive contact are greater than the capacitance of the second capacitive contact.

26. A device comprising a nanotube configured as a resonator, a source electrode, a gate electrode, a drain electrode and at least one reactive element, wherein the at least one reactive element is configured to minimize energy loss due to a contact resistance between at least the source electrode and the nanotube, wherein the at least one reactive element comprises an inductive element, the inductive element being connected in series with the source electrode.

27. A device according to claim 26, wherein the nanotube is arranged such that a first end portion of the nanotube is in contact with a surface of the source electrode and a second end portion of the nanotube extends from the source electrode generally above the gate electrode and the drain electrode.

28. A device according to claim 26, wherein the at least one reactive element further comprises:
a second inductive element, wherein the second inductive element is connected in series with the drain electrode.

29. A device according to claim 28, wherein the nanotube is arranged such that a first end portion of the nanotube is in contact with a surface of the source electrode and a second end portion of the nanotube is in contact with a surface of the drain electrode, and a middle portion of the nanotube, between the first and second end portions, bridges a gap between the source electrode and drain electrode, the middle portion of the nanotube being positioned generally above the gate electrode.

30. A method comprising:
providing a substrate;
forming, on the substrate, a source electrode, a gate electrode and a drain electrode;
forming a layer of solid insulating material in contact with a surface of the source electrode; and
fixing an end portion of a nanotube to an opposite surface, to that in contact with the source electrode, of the layer of solid insulating material.

31. A method according to claim 30, wherein forming the electrodes comprises forming the gate electrode generally between the source electrode and the drain electrode.

32. A method according to claim 30, wherein fixing an end portion of a nanotube, further comprises fixing a first end portion of the nanotube to the layer of solid insulating material, a second end portion of the nanotube extending generally above the gate electrode and the drain electrode.

33. A method according to claim 32, wherein fixing the nanotube comprises growing the nanotube on the layer of solid insulating material from seed.

34. A method according to claim 30, further comprising:
forming a second layer of solid insulating material in contact with a surface of the drain electrode; and
fixing an opposite end portion of the nanotube to an opposite surface, to that in contact with the drain electrode, of the second layer of solid insulating material.

* * * * *